United States Patent [19]

Murakami

[11] Patent Number: 5,736,801
[45] Date of Patent: Apr. 7, 1998

[54] FILTER CIRCUIT AND CONTROL CIRCUIT FOR CONTROLLING A ROTOR

[75] Inventor: Chikara Murakami, Tokyo, Japan

[73] Assignee: Ebara Corporation, Tokyo, Japan

[21] Appl. No.: 698,452

[22] Filed: Aug. 15, 1996

[30] Foreign Application Priority Data

Aug. 18, 1995 [JP] Japan .................. 7-233276

[51] Int. Cl.$^6$ .................................................. H02K 7/09
[52] U.S. Cl. ............................................................ 310/90.5
[58] Field of Search ................................................ 310/90.5

[56] References Cited

U.S. PATENT DOCUMENTS

| | | | |
|---|---|---|---|
| 4,992,714 | 2/1991 | Matsushita et al. | 310/90.5 |
| 5,365,787 | 11/1994 | Hernandez et al. | 324/207.25 |
| 5,486,729 | 1/1996 | Matsushita et al. | 310/90.5 |
| 5,576,587 | 11/1996 | Takahashi et al. | 310/90.5 |

OTHER PUBLICATIONS

Murakami, Chikara; "Complex gain compensation method for controlling magnetically levitated rotation body" published by The Institute of Electrical Engineers of Japan, Dec. 9, 1994, pp. 53–62.

Murakami, Chikara; "On Mixed Use of j in Complex Variable System of Rotor and in Phase Domain", Dynamics and Designs Conference, vol. B, published by Japan Society of Mechanical Engineers, Aug. 7, 1995, pp. 489–492.

Johnson, Bruce Graham, "Active Control of a Flexible, Two-Mass Rotor: The Use of Complex Rotation", Massachusetts Institute of Technology, Sep. 1986, pp. 221.

"Flexible Rotor Vibration Analysis Combined with Active Magnetic Bearing Control"; International Conference on rotordynamics, published by International Federation for the Theory of Machines and Mechanisms, and Japan Society of Mechanical Engineers, Sep. 14–17, 1986, 186, pp. 421, p. 425.

"Magnetic levitation and Magnetic Bearing" published by Corona Publishing Company, Japan, Jun. 1993, pp. 202–209.

*Primary Examiner*—Clayton E. LaBalle
*Attorney, Agent, or Firm*—Armstrong, Westerman, Hattori, McLeland & Naughton

[57] ABSTRACT

An input signal related to x- and y-axes is expressed by a complex variable ($\underline{U}$), a transfer function of a low-pass or high-pass filter having a real-number coefficient is represented by F(s), a central angular frequency, which may be either positive or negative, to be passed or rejected, is represented by $\omega$, an imaginary number unit is represented by j, and a complex coefficient transfer function produced by replacing "s" in the transfer function F(s) with (s−j$\omega$) is represented by $\underline{F}$(s−j$\omega$). An output signal related to the x- and y-axes which is generated when the input signal U passes through the complex coefficient transfer function $\underline{F}$(s−j$\omega$) is expressed using a complex variable ($\underline{V}$), producing a transfer expression formula:

$$\underline{U} \cdot \underline{F}(s-j\omega) = \underline{V}$$

Both sides of the transfer expression formula are multiplied by the denominator of F(s−j$\omega$), and connected with a transfer element of the real-number coefficient so that real and imaginary parts of the transfer expression formula are equal to each other.

16 Claims, 16 Drawing Sheets

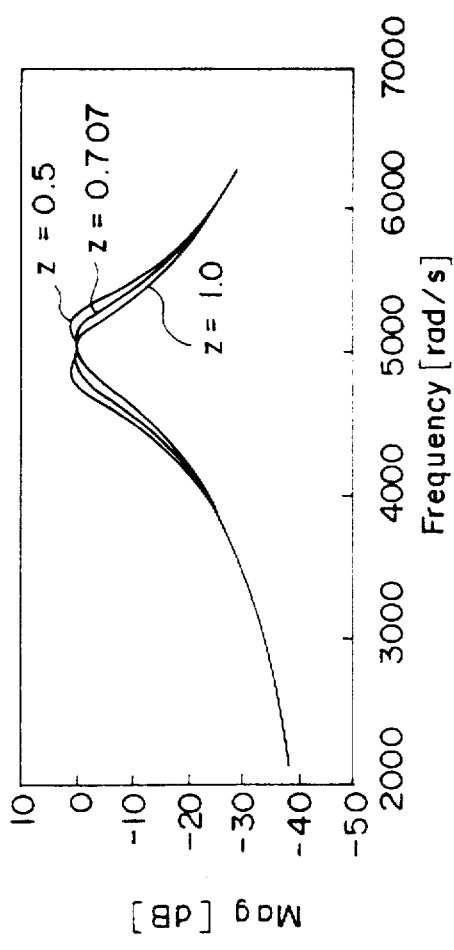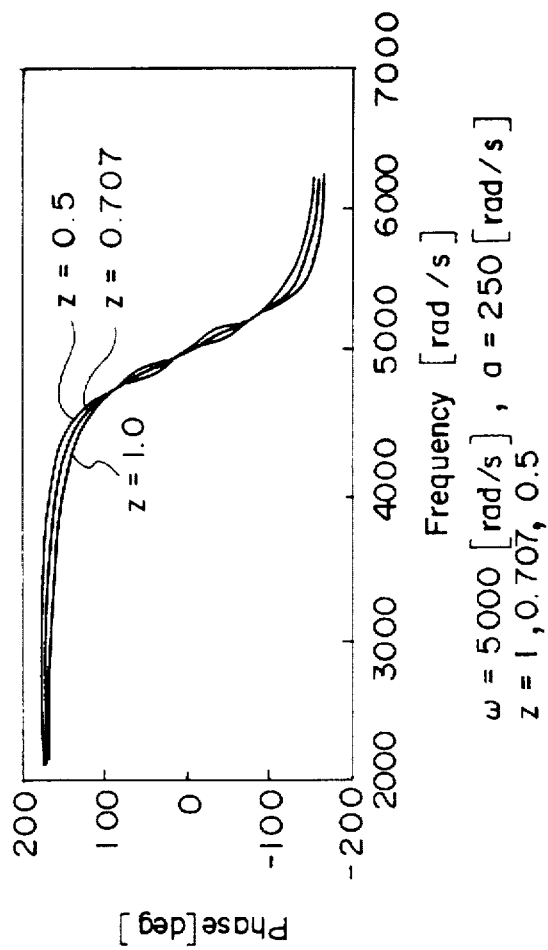
FIG.9A
FIG.9B

F I G. 13
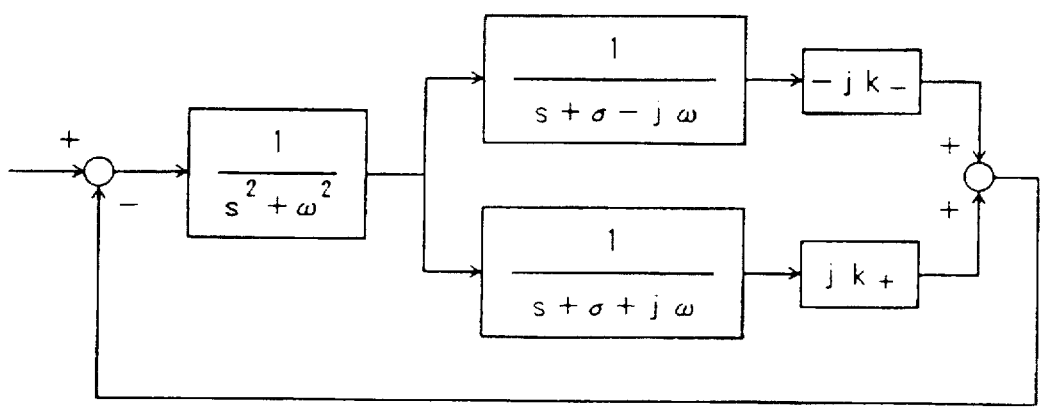

F I G. 15
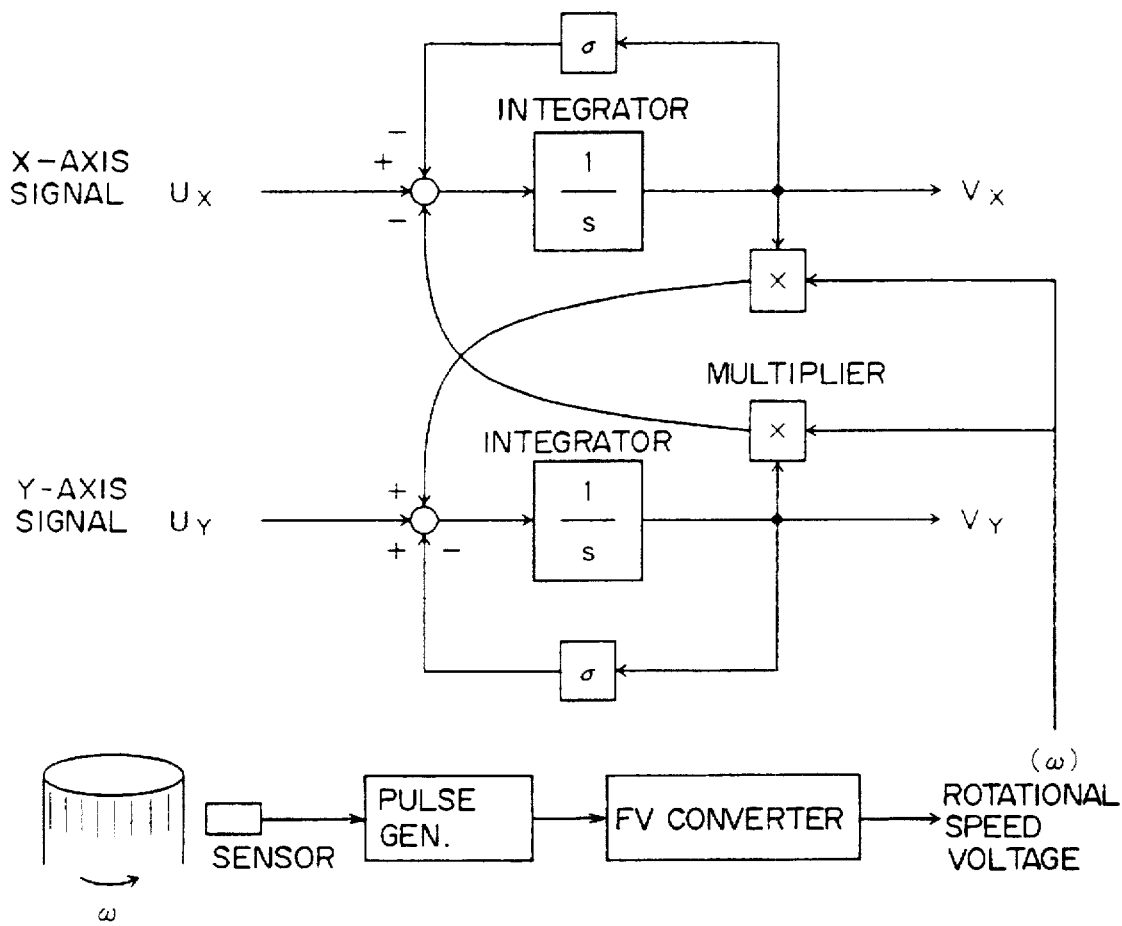

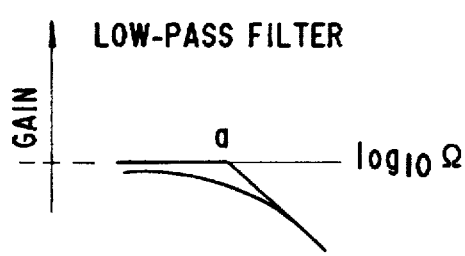
FIG.16A-1
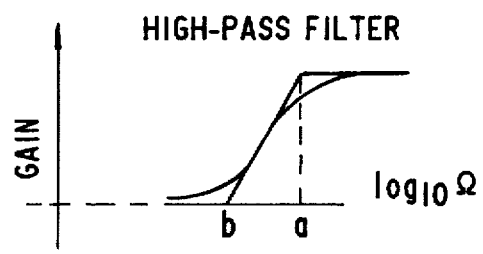
FIG.16B-1
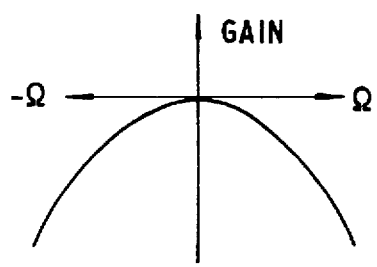
FIG.16A-2
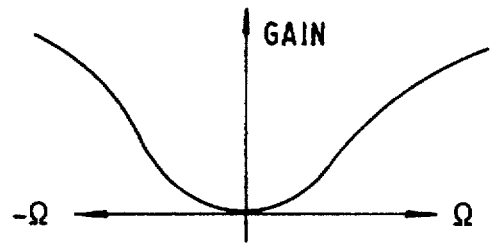
FIG.16B-2
FIG.17
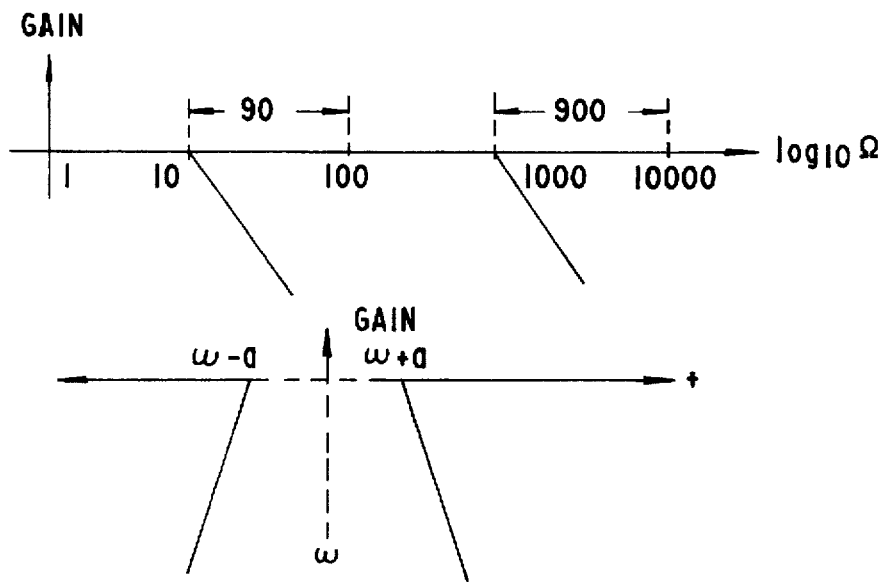

x-AXIS y-AXIS

FILTER CIRCUIT AND CONTROL CIRCUIT FOR CONTROLLING A ROTOR

BACKGROUND OF THE INVENTION

1. Field of the Invention

The present invention relates to a filter circuit and a control circuit for controlling a magnetic bearing used in a high-speed rotary machine, for example.

2. Description of the Prior Art

The shaft of a rotor which is supported by a magnetic bearing is generally subject to a whirling phenomenon due to motion (translational motion) of the center of gravity of the rotor and tilting motion (attitude motion) around the center of gravity. In order to suppress the whirling phenomenon, it has been customary to detect state quantities including the position, speed, and angle of inclination of the rotor and to control a current to be supplied to the electromagnets of the magnetic bearing based on the detected state quantities. According to one control process based on the above customary system, state quantities detected by sensors with respect to two radial axes perpendicular to the rotor shaft, i.e., x- and y-axes, are supplied to a control circuit having a transfer function suitable for the purpose of the control to produce desired output signals. Another control process employs a state quantity estimator known as an observer. Heretofore, the control circuit has been designed and constructed on the basis of a transfer function with real-number coefficients.

With the conventional rotor vibration control processes, it has been difficult to separate vibration modes which have equal or very close absolute values of the mode frequencies but opposite signs. Flexible modes of a rotor are highly likely to include two modes which have very close absolute values of the mode frequencies but opposite signs. There is an occasion where one of the modes should remain untouched as it is given sufficient damping for some reason, but if only the remaining other mode is unstable, then it should be selected as an unstable mode. However, because it has heretofore been difficult to select only the unstable mode according to the conventional scheme, both of the modes are necessarily controlled simultaneously, and hence the mode which should remain untouched tends to be adversely affected.

For controlling a rotor which rotates at high speed, it has been a conventional practice to design a filter circuit which passes or eliminates a narrow bandwidth in the vicinity of the rotational speed of the rotor. To achieve such a steep gain characteristic curve, two coordinate transformation circuits are indispensable. To carry out such a conventional practice, it is necessary to employ, in addition to low-pass filters, the two above-mentioned coordinate transformation circuits constructed by generating sine and cosine functions corresponding to the rotation angle of the rotor as disclosed in Japanese Patent Publication No. H2-42125.

According to the conventional processes, it has been impossible to adjust the phase angle as well as the gain to any optional value irrespective of the frequency.

SUMMARY OF THE INVENTION

It is an object of the present invention to provide a filter circuit and a control circuit for controlling a rotor, which make it possible to easily separate two modes which have equal or very close absolute values but opposite signs.

Another object of the present invention is to provide a filter circuit and a control circuit for controlling a rotor, which can adjust the gain and the phase angle irrespective to the frequency.

Conventional low-pass or high-pass filters do not distinguish between positive and negative signal angular frequencies $\Omega$, and have symmetric gain characteristics with respect to the origin, i.e., a frequency of zero, if a negative range of frequencies is also covered. This means that they have been used as bandpass or band-elimination filters having a central frequency of zero. As the break angular frequency a, b goes higher, therefore, the bandwidth of the filters increases. If the horizontal coordinate axis (abscissa) represents angular frequencies on a linear scale rather than a logarithmic scale $\log_{10} \Omega$, then it is difficult to obtain a steep gain characteristic curve (see FIGS. 16A and 16B).

On an ordinary Bode diagram, the gradient (dB/dec) of a gain characteristic curve approximated by a broken line is superficially the same in any frequency range. This can easily be understood because a change (increase) in the frequency represented by the abscissa on a linear scale is much larger than on a logarithmic scale at a higher break frequency. For example, a change of one decade in the break frequency of 10 is 100−10=90 and a change of one decade in the break frequency of 1000 is 10000−1000=9000. Therefore, even though the dB to the same one decade changes are the same on the logarithmic scale, the gradient of the former change is 100 times steeper than the gradient of the latter change on the linear scale.

A rotor is controlled on two orthogonal radial axes thereon. Therefore, it is frequently practiced to use a complex varable which comprises a real number representing a signal related to the x-axis and an imaginary number multiplied by j (imaginary unit) representing a signal related to the y-axis. A complex coefficient transfer function including complex coefficient is highly effective in handling those complex variables. In such a complex system, positive and negative frequencies should be distinguished from each other, and the characteristic root of the system does not necessarily become a conjugate root.

For a first-order low-pass filter a/(a+s), for example, "a" may be considered to represent a break frequency and zero may be considered to represent a central angular frequency. In the complex system, therefore, if the central angular frequency is not limited to zero, but is $\omega$, then the original low-pass filter changes to a complex coefficient transfer function a/{a+(s−j$\omega$)} having a symmetrical point of $\omega$. The break frequency "a" represents a distance from $\omega$, but not from zero, or represents one half of the passband. Even if $\omega$ is of a large value, it does not matter since change of s is measured from not zero but $\omega$. In the foregoing example, if $\omega$ is selected to be 1000 and a is 10, then the gradient of its broken line is 100 times steeper even on the logarithmic scale than the original one having a=1000, and a point ($\omega$−a), opposite to $\omega$, also serves as a break point, resulting in narrow steep bandpass characteristics (see FIG. 17).

Further, in the foregoing conventional method, it was deemed impossible to change the phase sharply by ±180 degree only for a specific range of angular frequencies. The present invention has been made on the basis of the above finding.

According to the present invention, there is provided a filter circuit for controlling a rotor in a system for electromagnetically controlling two radial x- and y-axes perpendicular to a rotational z-axis of the rotor, which is obtained by multiplying the both sides of a transfer expression formula:

$$\underline{U} \cdot \underline{F}(s-j\omega) = \underline{V} \tag{1}$$

by the denominator of $\underline{F}(s-j\omega)$, and connecting transfer elements of the real-number coefficient so that real and imaginary parts of the transfer expression formula are equal to each other, wherein an input signal related to the x- and y-axes (Laplace transform quantities thereof are presented by Ux, Uy) is expressed by a complex variable (U=Ux+jUy), a transfer function of a low-pass or high-pass filter having a real-number coefficient is represented by F(s), a central angular frequency, which may be either positive or negative, to be passed or rejected (eliminated or stopped), is represented by ω, an imaginary number unit is represented by j, and a complex transfer function produced by replacing "s" in the transfer function F(s) with (s−jω) is represented by F(s−jω), and an output signal related to the x- and y-axes (Laplace transform quantities thereof are presented by Vx, Vy) which is generated when the input signal U passes through the complex transfer function F(s−jω) is expressed using a complex variable (V=Vx+jVy).

The filter circuit for controlling the rotor according to the present invention is capable of separating two vibrational modes whose absolute values of the mode frequencies are very close to each other and which have usually opposite signs in flexible modes of the rotor, and selecting only one of the modes to estimate a state quantity thereof and apply a given control law thereto. Consequently, the filter circuit can control the rotor in a manner to match operating conditions of the rotor with a relatively simple device and piece of software, and allows the rotor to operate stably while it is being supported by a magnetic bearing or the like.

In the above filter circuit, central angular frequencies, which may be either positive or negative, to be passed and rejected are represented by $\omega_1$, $\omega_2$ ($\omega_1 \neq \omega_2$), and to pass a component including a bandwidth ($2a$) across the central angular frequency $\omega_1$ and reject a component including a bandwidth ($2b$) across the central angular frequency $\omega_2$, the complex transfer function is given as:

$$k(s+b-j\omega_2)/(s+a-j\omega_1) \text{ or}$$

$$k(s+b-j\omega_2)/\{(s-j\omega_1)^2+2za(s-j\omega_1)+a^2\}$$

where "k" represents an optional gain or coefficient and "z" represents an optional dimensionless constant.

In the above filter circuit, the numerator and/or denominator of the transfer function F(s) includes a second-order system expressed by $k(s^2+2zas+a^2)$ where "k" represents an optional gain or coefficient and $2a$ represents a pass or rejection bandwidth across the central angular frequency, and wherein the opposite ends of the bandwidth near break points in gain characteristics of the frequency characteristics of the filter are made closer to those of an ideal filter by replacing "s" with (s−jω) and a dimensionless number "z" is selected as an optional number.

A plurality of the above filter circuits are combined to pass or reject a particular band in an entire frequency band including a negative frequency range. This is also useful for controlling the phase characteristic of the system.

In the above filter circuit, the frequencies ω, $\omega_1$, $\omega_2$ comprise variables, not constants, the variables being of instantaneous values.

According to the present invention, there is also provided a control circuit for controlling a rotor in a system for electromagnetically controlling two radial x- and y-axes perpendicular to a rotational z-axis of the rotor, including a filter section for extracting an angular frequency component or band component, which may be either positive or negative, from an input signal, and a phase section for giving a phase angle to the extracted component, so that an output signal which has passed through both sections is used to estimate a state quantity required for control or fed back to stabilize a mode of the extracted component, wherein the phase section for giving a phase angle comprises a complex gain circuit expressed by A+jB=Fc where A, B are real constants, and is connected such that an input signal (Ux, Uy) from the x- and y-axes to the complex gain circuit and an output signal (Vx, Vy) from the complex gain circuit to the x- and y-axes are related to each other by Vx=AUx−BUy, Vy=BUx+AUy, and that the phase of the output signal can be increased or decreaced by an optional phase angle irrespective of the frequency of the input signal by optionally selecting A, B, and an optional phase angle is given only to a frequency range required to generate a control signal or to estimate a control-related signal.

According to the present invention, there is further provided a filter circuit for controlling a rotor in a system for electromagnetically controlling two radial axes perpendicular to a rotational axis of the rotor, by receiving an input signal related to the two radial axes and extracting a positive or negative angular frequency component required to produce a two-axis control signal, wherein signal passages for the respective two radial axes have respective integrators, negative feedback loops for feeding back output signals from the integrators with a gain which is ½ of a pass bandwidth, and feedback loops for feeding back output signals from the integrators across between the two radial axes such that the output signal from one of the axes to the other axis is positive and the output signal from the other axis to the one of the axes is negative, the feedback loops having a central angular frequency to be passed which is inserted as a gain to selectively pass the central angular frequency therethrough.

According to the present invention, there is also provided a filter circuit for controlling a rotor in a system for electromagnetically controlling two radial axes perpendicular to a rotational axis of the rotor, by receiving an input signal related to the two radial axes and rejecting or passing a positive or negative angular frequency component required to produce a two-axis control signal, wherein signal passages for the respective two radial axes have direct passages each having a gain 1, parallel first-order low-pass filters branched respectively from the direct passages for producing respective output signals which are multiplied by a gain that is produced by subtracting ½ of a rejection bandwidth or a bottom bandwidth (distance between the two external break points) for a pass filter from a break frequency of the low-pass filters, and returned subtractively to the direct passages, and feedback passages for feeding back the output signals respectively from the low-pass filters to the low-pass filters across between the two radial axes, the feedback passages having a central angular frequency to be rejected or passed, inserted as a gain, the feedback passages being connected to the low-pass filters at junctions such that the output signal from one of the axes to the other axis is added at one of the junctions and the output signal from the other axis to the one of the axes is subtracted at the other of the junctions for thereby rejecting or passing a signal in a band across the central angular frequency.

According to the present invention, there is also provided a filter circuit for controlling a rotor in a system for electromagnetically controlling two radial axes perpendicular to a rotational axis of the rotor, by receiving an input signal related to the two radial axes, passing a positive or negative angular frequency component $\omega_1$ required to produce a two-axis control signal, and rejecting another positive or negative angular frequency component $\omega_2$, wherein signal passages for the respective two radial axes have direct passages each having a gain 1, parallel circuits branched respectively from the direct passages, one of the parallel circuits having a gain that is produced by subtracting ½ of a pass bandwidth which is a break frequency of a first-order low-pass filter connected to the one of the parallel circuits, from an angular frequency which is ½ of a rejection bandwidth, the other of the parallel circuits having a gain represented by $\omega_1-\omega_2$, the parallel circuits being connected to input terminals of respective first-order low-pass filters across between the two radial axes at junctions such that the output signal from one of the axes to the other axis is added at one of the junctions and the output signal from the other axis to the one of the axes is subtracted at the other of the junctions, and that the low-pass filters apply respective output signals additively to the respective direct passages and also feed back the output signals through a gain represented by $\omega_1$ to input terminals of the low-pass filters across between the two radial axes at junctions such that the output signal from one of the axes to the other axis is added at one of the junctions and the output signal from the other axis to the one of the axes is subtracted at the other of the junctions for thereby passing a nearby bandwidth across the frequency $\omega_1$ and rejecting a nearby bandwidth across the frequency $\omega_2$.

According to the present invention, there is still further provided a control circuit for controlling a rotor in a system for electromagnetically controlling two radial axes perpendicular to a rotational axis of the rotor, by receiving an input signal related to the two radial axes and outputting a two-axis control signal, wherein an angular frequency component or band, which may be either positive or negative, is extracted from the input signal, and signal passages related respectively to the two radial axes are branched into respective branch passages, and that each of the signal passages applies an output signal through a gain represented by a first constant A, each of the branch passages applies an output signal through a gain represented by a second constant B to the signal passage from which the each of the branch passages is not branched, across between the two radial axes at junctions such that the output signal from one of the axes to the other axis is added at one of the junctions and the output signal from the other axis to the one of the axes is subtracted at the other of the junctions.

The control circuit for controlling the rotor according to the present invention is capable of simultaneously adjusting the gain and the phase irrespective of the frequency, which have heretofore been impossible to adjust, and hence of controlling the rotor in a manner to match operating conditions of the rotor.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 9A and 9B are diagrams showing characteristics of the filter circuit according to the fourth embodiment shown in FIG. 8;

FIG. 13 is a block diagram showing a transfer function of the control circuit shown in FIG. 12;

FIG. 15 is a block diagram of a tracking filter according to the present invention;

FIGS. 16A and 16B are graphs showing characteristics of conventional filter circuits;

FIG. 17 is a diagram showing characteristics of a filter circuit according to the present invention;

DETAILED DESCRIPTION OF THE PREFERRED EMBODIMENTS

Figure 1:
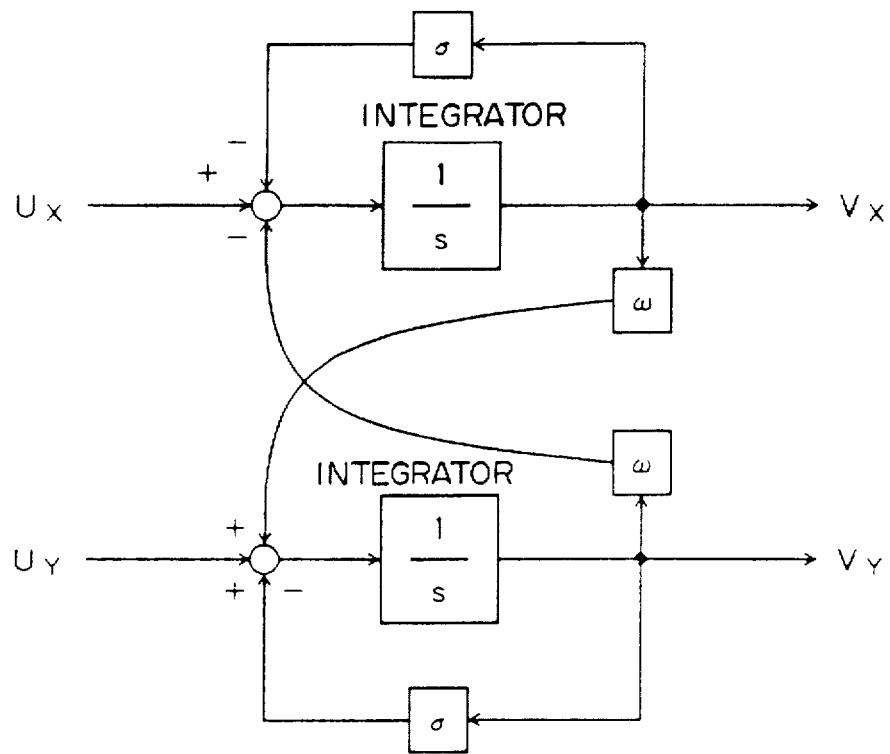
FIG. 1 is a block diagram of a filter circuit according to a first embodiment of the present invention.

FIG. 1 shows in block diagram form a filter circuit according to a first embodiment of the present invention.

The filter circuit shown in FIG. 1 is incorporated in a magnetic bearing device having a rotor which is magnetically supported, electromagnets for magnetically controlling the rotor on two x- and y-axes perpendicular to the spinning axis of the rotor, displacement sensors for detecting displacements of the rotor along the respective x- and y-axes, and power amplifiers for transmitting drive signals to the electromagnets. The filter circuit serves as part of a control circuit for receiving a two-axis displacement signal $\underline{U}=(U_x, U_y)$ from the displacement sensors and outputting a two-axis filtered signal $\underline{V}=(V_x, V_y)$ to to the remainder of the control circuit which generates control signal and transmit it to the power amplifier. The filter circuit is constructed on the basis of a transfer function $F_1(s)$ of a low-pass filter which has a first-order real-number coefficient, as given below.

$$F_1(s)\equiv 1/(s+\sigma) \qquad (2)$$

If a complex coefficient transfer function produced by replacing "s" in the transfer function $F_1(s)$ with $(s-j\omega)$ is represented by $\underline{F}_1(s-j\omega)$, then the input and the output signals related to the x- and y-axes (Laplace transform quantities thereof are presented by Ux, Uy and Vx, Vy) which are expressed using complex variables ($\underline{U}=Ux+jUy$ and $\underline{V}=Vx+jVy$) are related by a transfer expression formula:

$$\underline{U}\cdot\underline{F}_1(s-j\omega)=\underline{V} \qquad (3)$$

This transfer expression formula becomes:

$$(U_x+jU_y)/(s+\sigma-j\omega)=V_x+jV_y \tag{4}$$

By multiplying both sides of the above formula by $(s+\sigma-j\omega)$, expanding them, and associating real and imaginary parts with each other, the following equations are obtained:

$$U_x-\sigma V_x-\omega V_y=sV_x \tag{5}$$

$$U_y-\sigma V_y+\omega V_x=sV_y \tag{6}$$

The filter circuit shown in FIG. 1 is generated when the above equations are substantiated. Specifically, the filter circuit shown in FIG. 1 has integrators 1/s connected in respective signal paths for the x- and y-axes and negative feedback loops for feeding back output signals from the integrators, accompanied by σ representing ½ of the pass bandwidth, thus providing a first-order low-pass filter. The output signals from the integrators are also fed back between the x- and y-axes such that the output signal from the x-axis to the y-axis is fed back as a positive signal and the output signal from the y-axis to the x-axis is fed back as a negative signal. An angular frequency ω to be passed is inserted as a gain in the feedback loops, which can thus selectively pass the angular frequency component.

Figure 2A:
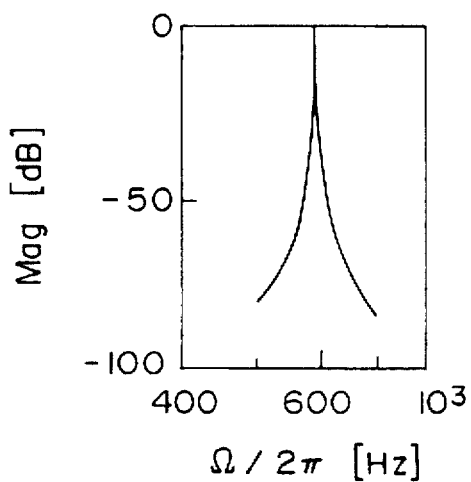
FIGS. 2A and 2B are diagrams showing characteristics of the filter circuit according to the first embodiment shown in FIG. 1.
Figure 2B:
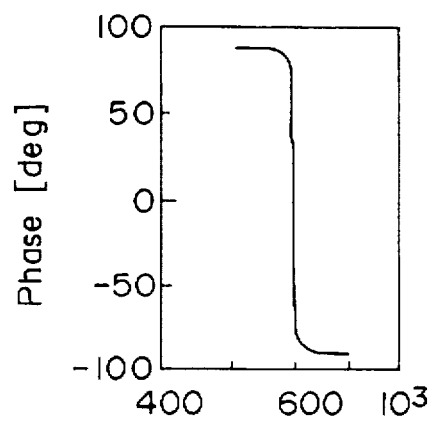

FIGS. 2A and 2B show Bode diagrams of the filter circuit $F_1(s-j\omega)=1/(s+\sigma-j\omega)$ which are plotted at the time ω=3750 [rad/s], σ=6.3 [rad/s], substituting s=jΩ and changing Ω. The Bode diagrams indicate that a frequency band including a central angular frequency which may either be positive or negative is passed with sharp selectivity.

Figure 18:
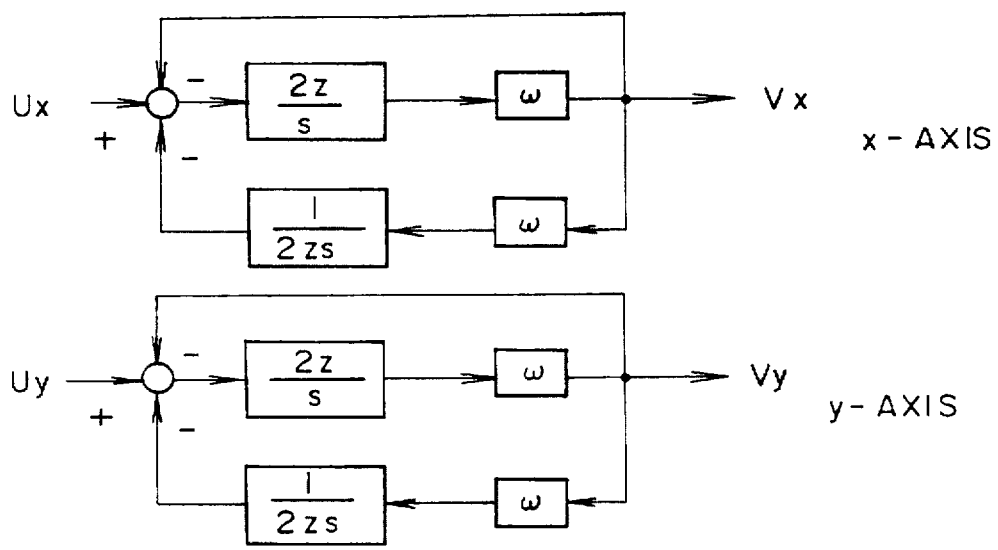
FIG. 18 is a block diagram of a conventional filter circuit.

A conventional biquad filter corresponding to the filter circuit shown in FIG. 1 is expressed as follows:

$$V=\{2z\omega s/(s^2+2z\omega s+\omega^2)\}U \tag{7}$$

where z indicates a dimensionless number giving the sharpness of the filter, and corresponds to the reciprocal of a damping ratio or selectivity. The equation (7) is of a real-number system and should be provided individually for the two x- and y-axes. One specific block diagram of a filter circuit for the equation (7) for the two x- and y-axes is shown in FIG. 18. The filter circuit shown in FIG. 18 has a total of four integrators, two for each axis. With "z" being fixed, the gradient of attenuation is constant in a Bode diagram. If the abscissa is drawn on a linear scale, then the sharpness is reduced in a high-frequency range, and the bandwidth equivalently increases.

For the application to a tracking filter, therefore, it is necessary to reduce "z" as ω increases. Since ω is a variable, ω in FIG. 18 needs a multiplier. Because four such multipliers are required, the cost or the time required for calculations increases. The equation (7) is incapable of distinguishing positive and negative values of ω. On the other hand, the complex filter shown in FIG. 1 has a bandwidth of σ that remains unchanged, is simple and clear-cut, needs half as many pieces of hardware as the filter circuit shown in FIG. 18, and consumes a shorter time for calculations if digital control is used.

Figure 3A:
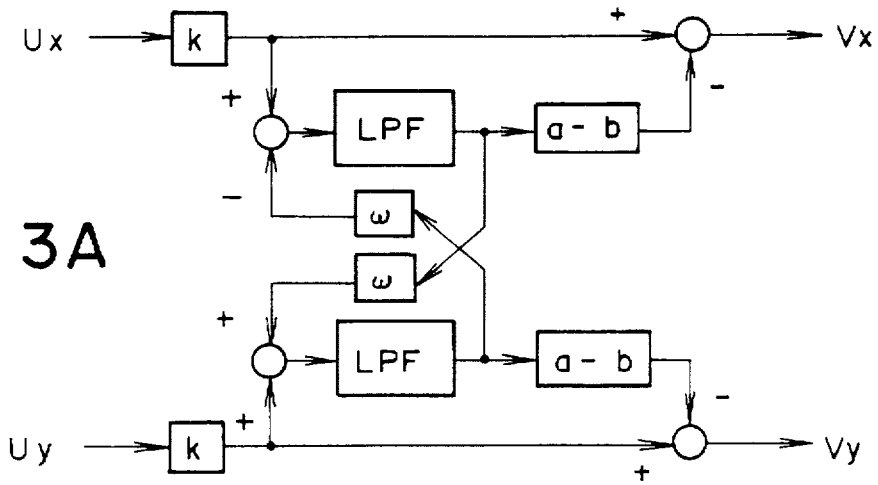
FIGS. 3A and 3B are block diagrams of a filter circuit according to a second embodiment of the present invention.

FIG. 3A shows in block form a filter circuit according to a second embodiment of the present invention. The filter circuit comprises a notch filter for rejecting the passage of a specific frequency signal only.

A real-number coefficient transfer function which serves as a basis for the notch filter is given as follows:

$$F_2(s)=k(s+b)/(s+a), a>b>0 \tag{8}$$

A complex coefficient transfer function is represented by $F_2(s-j\omega)$ which is produced by replacing "s" in the equation (8) with (s-jω). A specific connection arrangement for this function will not be described in detail as it is a special case where $\omega_1=\omega_2=\omega$ in $F_3$ (described later on).

The filter circuit shown in FIG. 3A is a substantiated form of the real-number coefficient transfer function.

Figure 3B:
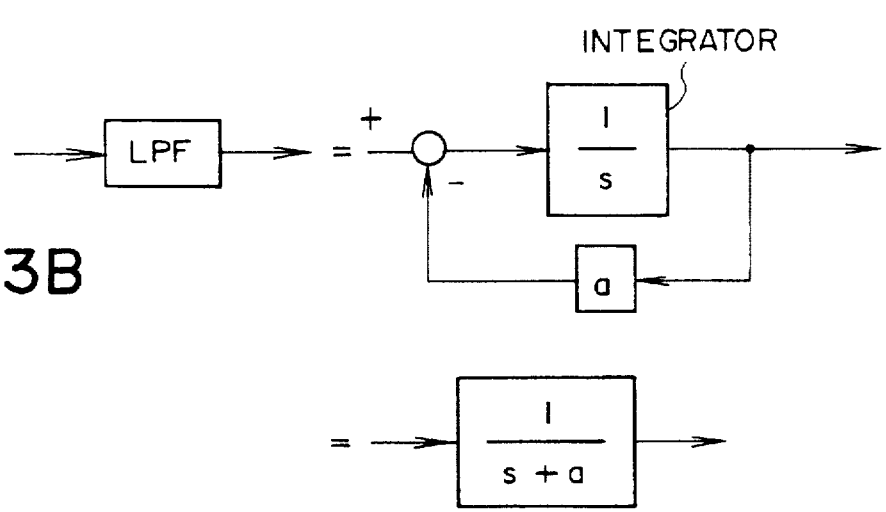
Figure 4A:
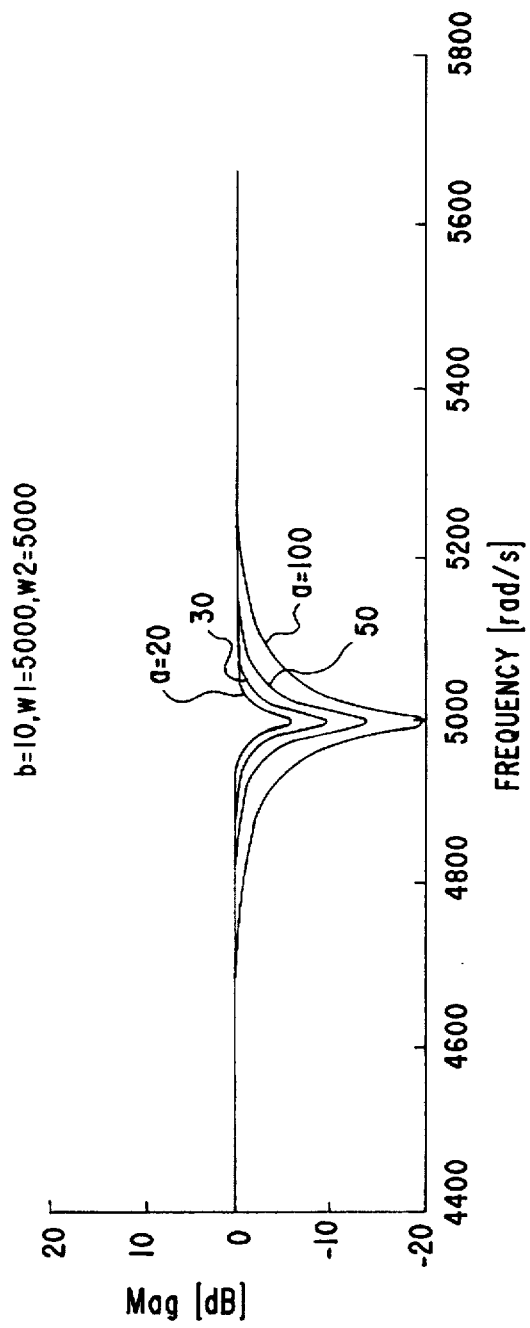
FIGS. 4A and 4B are diagrams showing characteristics of the filter circuit according to the second embodiment shown in FIG. 3.
Figure 4B:
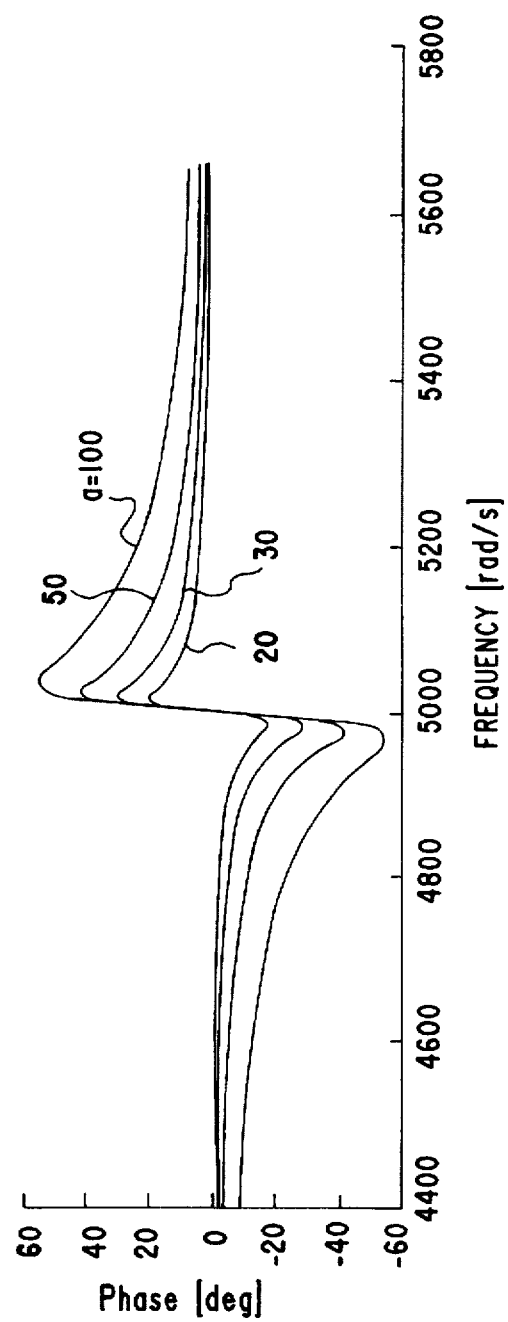

In FIG. 3A, the filter circuit includes two signal passages for the respective axes which have respective direct passages each having a gain "k", first order low-pass filters (LPF) branched from and connected parallel to the direct passages, passages connected to output terminals of the low-pass filters for multiplying output signals from the low-pass filters by a gain (a−b) that is produced by subtracting "b" which is half the rejection bandwidth from a break frequency "a" of the low-pass filters, and supplying product signals back to the direct passages, and crossing passages for feeding the output signals from the low-pass filters back to the opposite low-pass filters across between the axes. Each of the low-pass filters comprises an integrator and a gain "a" fed back across the integrator, as shown in FIG. 3B. An angular frequency to be rejected is inserted as a gain in each of the crossing passages. The crossing passages are connected to the opposite low-pass filters such that the low-pass filter output signal from the x-axis to the y-axis is added and the low-pass filter output signal from the y-axis to the x-axis is subtracted. As a result, the signals of the angular frequency components cancel out each other, and hence they are rejected. The filter circuit may be compensated to maintain stable operation by rejecting the passage of only one of positive and negative angular frequencies and giving appropriate phase to the remaining signal. By setting the constants b>a>0, the filter circuit of the embodiment operates as a band-pass filter, and by setting constants k=a/b, the bottom of the band-pass filter characteristic will be 0 |dB|. Since, in the area adjacent to and out of the rejection or pass bandwidth, the filter does not give a significant change of gain but for phase change (see FIG. 4 ), this characteristic can be usable for controlling certain systems.

Figure 5:
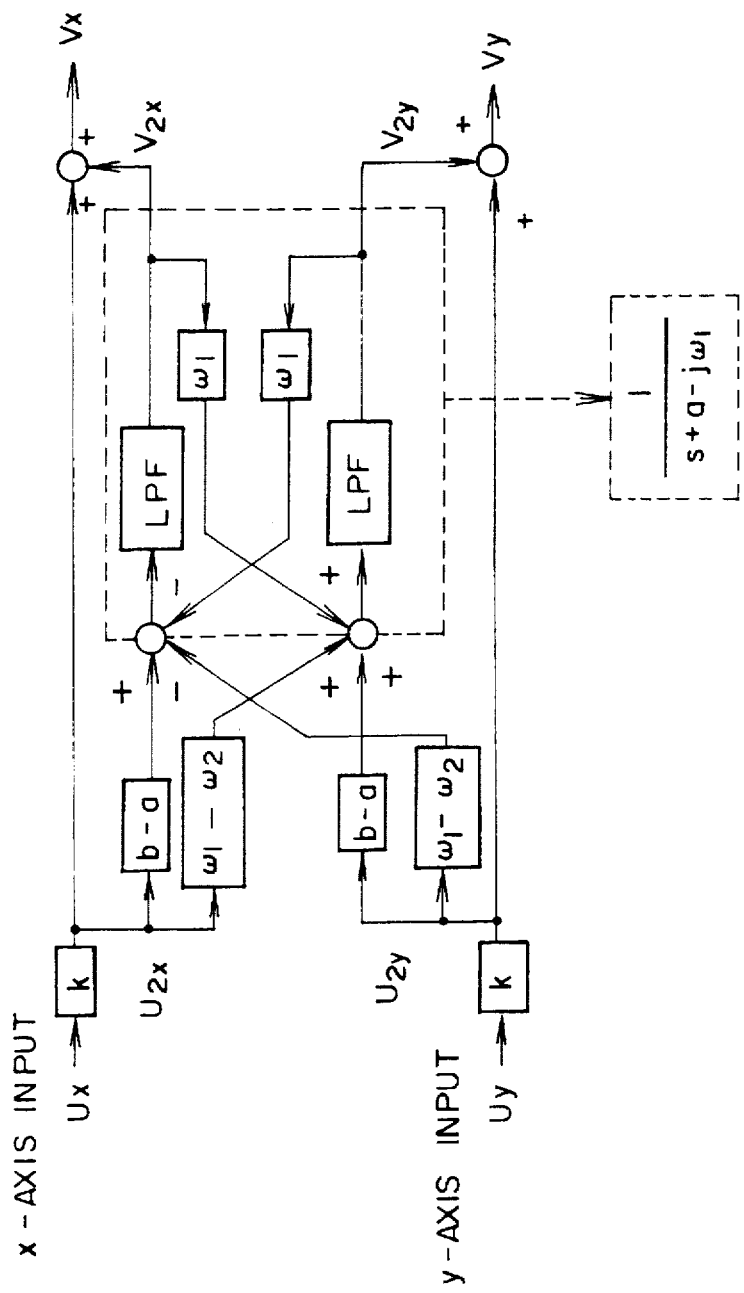
FIG. 5 is a block diagram of a filter circuit according to a third embodiment of the present invention.

FIG. 5 shows in block diagram form a filter circuit according to a third embodiment of the present invention. The filter circuit according to the third embodiment is a combination of the filter circuits according to the first and second embodiments, and is functionally equivalent to a series-connected circuit arrangement of the filter circuits according to the first and second embodiments. Specifically, the filter circuit according to the third embodiment passes a positive or negative angular frequency component $\omega_1$ required to form a two-axis control signal and rejects another positive or negative angular frequency component $\omega_2$.

"s" in the denominator and numerator, both of which are of a first order, of a transfer function:

$$F_3=k(s+b)/(s+a) \tag{9}$$

is replaced with (s−jω₂), (s−jω₁), respectively, to produce a complex coefficient transfer function:

$$F_3=k(s+b-j\omega_2)/(s+a-j\omega_1) \tag{10}$$

The filter circuit according to the third embodiment is expressed by this complex coefficient transfer function. When the degree of order of the numerator is lowered, the complex coefficient transfer function becomes:

$$F_3 = k\{s + a - j\omega_1 - a + b + j(\omega_1 - \omega_2)\}/(s + a - j\omega_1) \quad (11)$$
$$= k + k[\{b - a + j(\omega_1 + \omega_2)\}/(s + a - j\omega_1)]$$

Therefore, the filter circuit is divided into an element which multiplies an input signal by k and passes it, and an element having a first order lag or low-pass filter which contains a complex constant of the second term of the equation (11). Only a process of constructing the second term will be described below.

If an output signal $\underline{V}_2 = V_2x + jV_2y$ is produced by multiplying the second term without k by $\underline{U}_2 = (U_2x + jU_2y)$, an input signal, then since the real and imaginary parts of the complex number equation are equal to each other, both sides are multiplied by the denominator to produce:

$$U_2x(b-a) - U_2y(\omega_1-\omega_2) = V_2x(s+a) + V_2y\omega_1 \quad (12)$$

$$U_2x(\omega_1-\omega_2) + U_2y(b-a) = V_2y(s+a) - V_2y\omega_1 \quad (13)$$

From the equation (12) is derived the following equation:

$$V_2x = \{U_2x(b-a) - U_2y(\omega_1-\omega_2) - V_2y\omega_1\}/(s+a) \quad (14)$$

From the equation (13) is derived the following equation:

$$V_2y = \{U_2x(\omega_1-\omega_2) + U_2y(b-a) + V_2x\omega_1\}/(s+a) \quad (15)$$

Multiplying the denominator and numerator of the equation (10) by conjugate of the denominator to convert the denominator into a real number is not desirable because it would increase both the degrees of order and numbers of the constructiong elements of the system.

Connections according to the equation (15) are shown in FIG. 5.

In FIG. 5, the filter circuit has two direct passages each having a gain of 1 and two parallel circuits branched respectively from the direct passages. One of the parallel circuits is given a gain (b−a) produced by subtracting a break frequency "a" of a low-pass filter LPF from "b" which is half the rejection bandwidth, and inputting the gain (b−a) to the low-pass filter LPF. The other parallel circuit is given a gain $(\omega_1-\omega_2)$, and is connected along a crossing path to the input terminal of the low-pass filter LPF. The parallel circuits are connected such that an output signal from a first axis to a second axis is added and an output signal from the second axis to the first axis is subtracted.

A circuit including a low-pass filter LPF, which is the same as the low-pass filter shown in FIG. 3B, and a crossing feedback loop of $\omega_1$ is the same as described with reference to FIG. 1 except that σ is replaced with "a" and ω is replaced with $\omega_1$. Specifically, the signal paths for the respective axes have respective integrators and negative feedback loops for feeding back output signals from the integrators, accompanied by σ representing ½ of the pass bandwidth. The output signals from the integrators are also fed back between the x- and y-axes such that the output signal from the x-axis to the y-axis is fed back as a positive signal and the output signal from the y-axis to the x-axis is fed back as a negative signal. An angular frequency $\omega_1$ to be passed is inserted as a gain in the crossing feedback loops. Output signals from a bandpass filter as a whole are added to the direct passages.

Figures 6A, 6B:
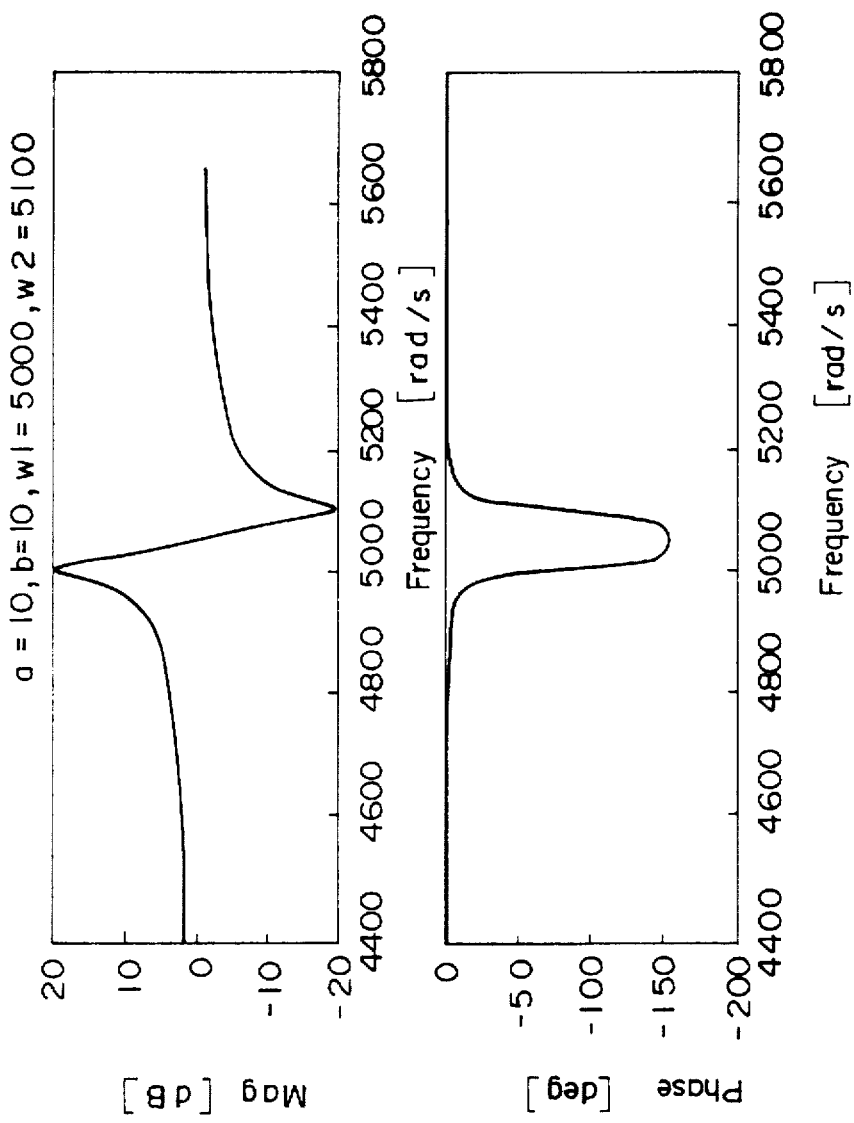
FIGS. 6A and 6B are diagrams showing characteristics of the filter circuit according to the third embodiment shown in FIG. 5.

The filter circuit shown in FIG. 5 is effective particularly in the case where $\omega_1 \approx \omega_2$, i.e., where only the mode of $\omega_1$ is to be selected and the mode of $\omega_2$, which is immediately close thereto, is to be untouched. FIGS. 6A and 6B show Bode diagrams of the filter circuit which are plotted at the time a=b=10 [rad/s], $\omega_1$=5000 [rad/s], $\omega_2$=5100 [rad/s]. Though the frequencies are close to each other and a considerable bandwidth is available, the difference between passing and rejecting gains is of about 40 [dB], which indicates the effectiveness of this filter circuit.

Figure 7A:
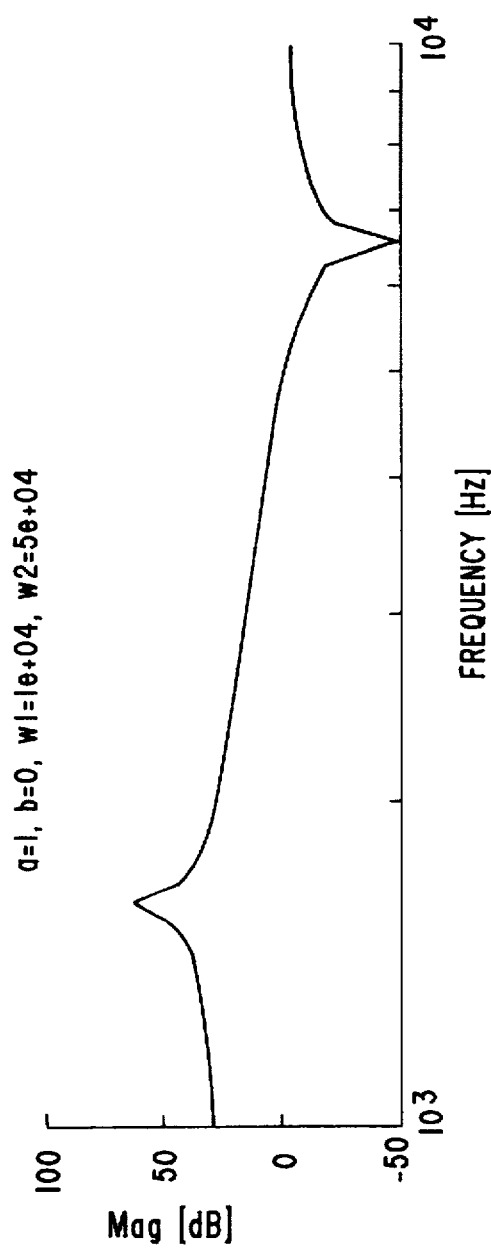
FIGS. 7A and 7B are diagrams showing characteristics of the filter circuit according to the third embodiment shown in FIG. 5 having different constants.
Figure 7B:
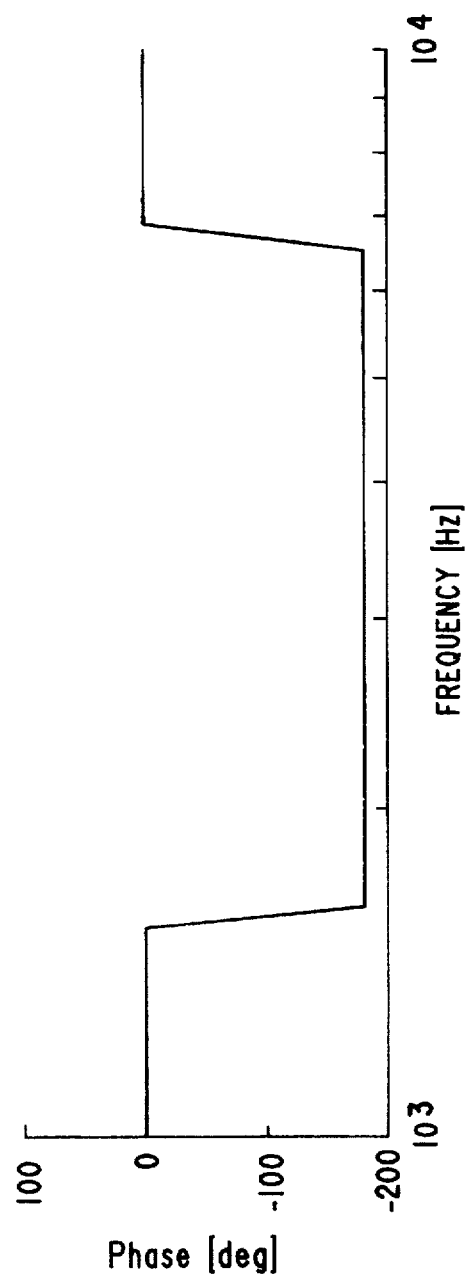

FIGS. 7A and 7B show a Bode diagrams of the filter circuit shown in FIG. 5 where the constants are set different from the embodiment shown in FIGS. 6A and 6B. This is aimed to operate in a way to delay the phase angle by 180 degrees only for a specific angular frequency bandwidth without affecting the phase angle of other bandwidth. This is the case when $\omega_1$=10000 [rad/s], $\omega_2$=40000 [rad/s], b=0, a=1 [rad/s]. Here, "a" is set small so far as the fliter circuit does not oscillate, thus inverting the phase sharply for a bandwidth between the two angular frequencies. "b" may be preferably set zero or small quantity for a sharp reverse. However, the gain characteristic has not become totally flat. By reversing $\omega_1$ and $\omega_2$, the phase between the two go forward by 180 degrees vice versa, and the gradient of the gain will be reversed.

Figure 19:
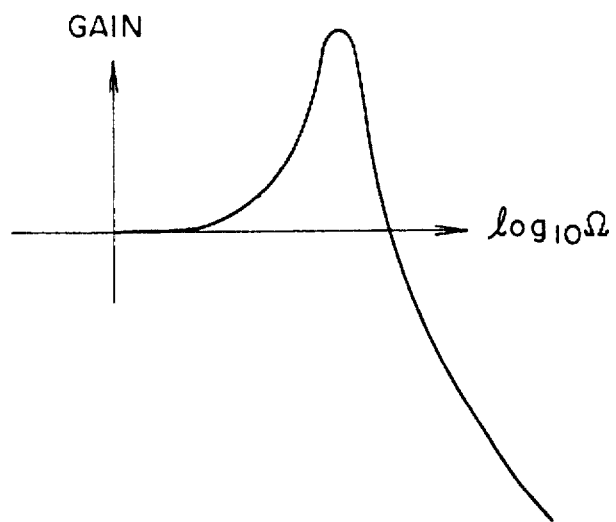
FIG. 19 is a graph showing characteristics of a conventional second-order filter circuit.

An example of conversion from a low-pass filter of second order whose transfer function has real-number coefficients and which is expressed by an equation given below, into a bandpass filter having a steep gain characteristic curve will be described below.

$$F_4 = ka^2/(s^2 + 2zas + a^2) \quad (16)$$

where "z" is normally referred to as an damping ratio. It is customary to set the damping ratio to Z<1 to make a bump near a break point narrower and higher to provide resonance characteristics. According to such a utilization process, a higher-frequency side of the bump has a somewhat steep characteristic curve, but a lower-frequency side of the bump has a shallow bottom. Thus, it is general to multiply the numerator of the equation (16) by "s". However, it is complex to design the configuration of the bump (see FIG. 19).

According to the present invention, a filter of second order itself has a steep characteristic curve, allows a bump configuration as well as a bandwidth to be selected freely, and also allows positive and negative passbands to be selected freely. In order to set any optional central angular frequency ω, which may be either positive or negative, again as a reference, "s" in the equation (16) is replaced with (s−jω). By multiplying both sides of the equation (16) by the denominator containing the complex number, the relationship between input signals $\underline{U}, \underline{V}$ is expressed as follows:

$$ka^2\underline{U} = \{(s-j\omega)^2 + 2za(s-j\omega) + a^2\}\underline{V} \quad (17)$$
$$= \{(s^2 + 2zas + a^2 - \omega^2) - j2(\omega s + za\omega)\}(Vx + jVy)$$

Since the real and imaginary parts of the above equation are equal to each other, the following equations are obtained:

$$\{ka^2Ux - 2(\omega s+za\omega)Vy\}/(s^2+2zas+a^2-\omega^2) = Vx \quad (18)$$

$$\{ka^2Uy + 2(\omega s+za\omega)Vx\}/(s^2+2zas+a^2-\omega^2) = Vy \quad (19)$$

Figure 8:
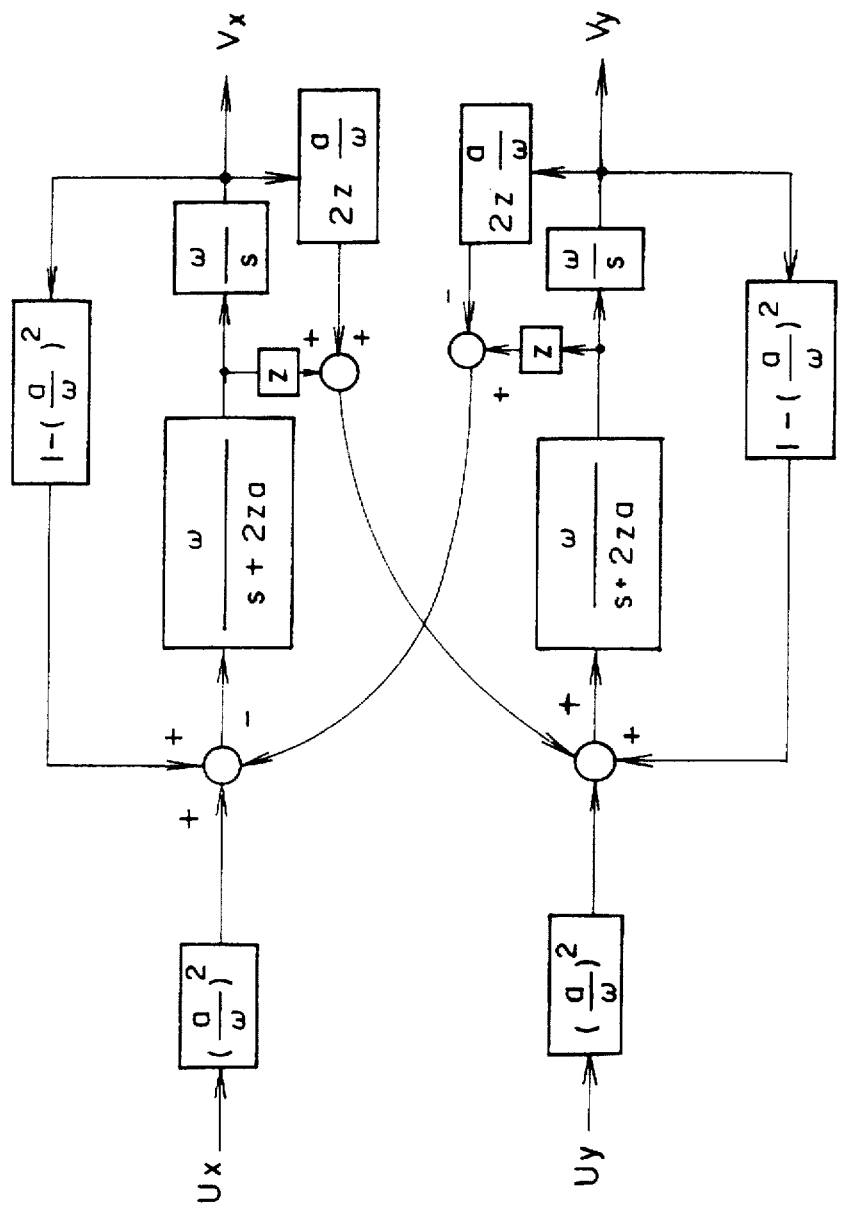
FIG. 8 is a block diagram of a filter circuit according to a fourth embodiment of the present invention.

The denominators and numerators of the equations (18), (19) are divided by $\omega^2$, and the resultant equations are substantiated into a circuit which is shown in FIG. 8 where k is omitted.

In FIG. 8, the x- and y-axes are associated with respective second-order circuits, which are interconnected by crossing passages to provide highly sophisticated functions and performance. FIGS. 9A and 9B show three Bode diagram curves where z=0.5, 0.707, 1.0, which are plotted at the time a=250 [rad/s], ω=5000 [rad/s]. In FIGS. 9A and 9B, the abscissa represents the angular frequency on a linear scale. The bandwidth can be given by 2a. Appropriate selection of "z" is effective to improve corners of the bandwidth. The smaller the bandwidth, the steeper the gain characteristic curve.

Figure 10:
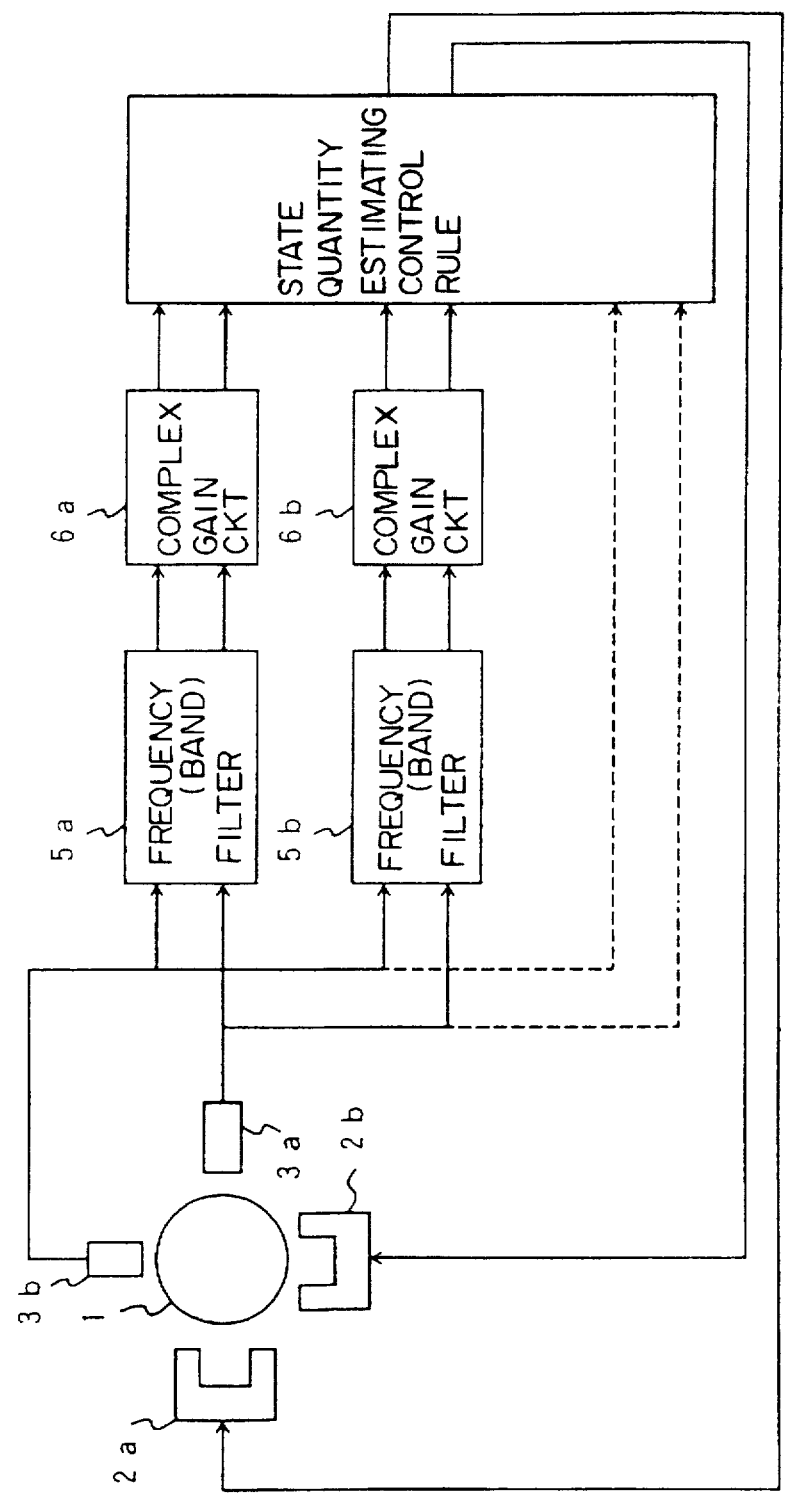
FIG. 10 is a block diagram of a control apparatus which incorporates a control circuit for controlling a rotor according to an embodiment of the present invention.
Figure 11:
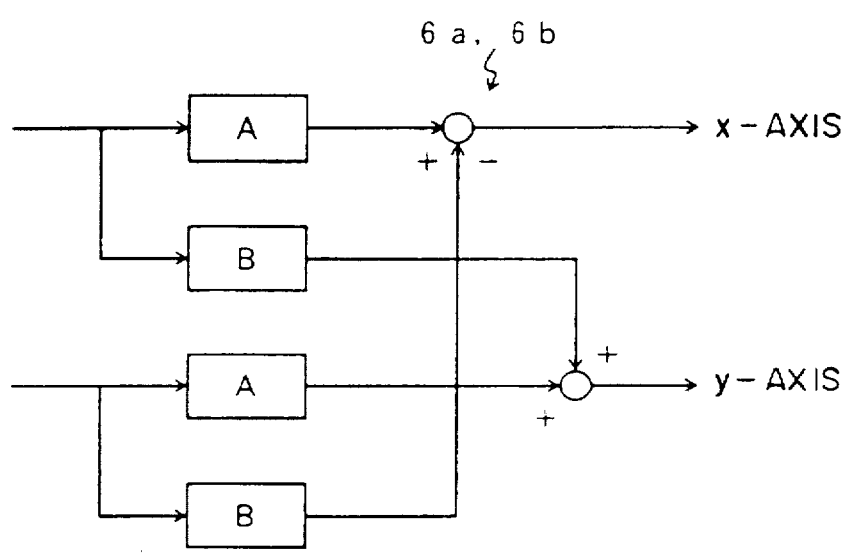
FIG. 11 is a block diagram of each of complex gain circuits in the control apparatus shown in FIG. 10.

FIG. 10 shows in block diagram form a control apparatus which incorporates a control circuit for controlling a rotor according to an embodiment of the present invention. The control apparatus extracts a necessary angular frequency component or band, irrespective of whether it may be positive or negative, from an input signal which is output by sensors, gives a necessary phase angle to the component or band, and feeds back the component or band with the given phase angle to stabilize the component or band or utilize the component or band for estimating other information required for control.

The control circuit is incorporated in a magnetic bearing device having a rotor 1 which is magnetically supported, a pair of electromagnets 2a, 2b for magnetically controlling the rotor 1 on two x- and y-axes perpendicular to the axis of the rotor 1, displacement sensors 3a, 3b for detecting displacements of the rotor 1 along the respective x- and y-axes, and power amplifiers 4a–4d (see FIG. 12) for transmitting drive signals to the electromagnets 4a–4d. The control circuit receives a two-axis displacement signal $\underline{U}=(U_x, U_y)$ from the displacement sensors 3a, 3b and outputs a two-axis control signal $\underline{V}=(V_x, V_y)$ to the power amplifiers 4a–4d. Since the electromagnets 2a, 2b produce only attractive forces, another pair of electromagnets is also positioned diametrically across the rotor 1. The pairs of electromagnets are supplied with control signals of opposite signs.

The control circuit has pass, rejection, or combination filters 5a, 5b, ⋯ for passing respective different frequencies or rejecting nearby unwanted frequency components.

Complex gain circuits 6a, 6b, ⋯ are connected to the respective filters 5a, 5b, ⋯. In each of the complex gain circuits 6a, 6b, ⋯, signal passages for the two radial axes are branched into crossing passages, with a constant A given as a gain to one of the passages and a constant B given as a gain to the other of the passages which are crossing ones. The crossing passages are connected to junctions behind the gains A across between the signal passages. The crossing passages are connected to the junctions such that an output signal from the x-axis to the y-axis is added to the junction and an output signal from the y-axis to the x-axis is subtracted from the junction.

The complex gain circuits 6a, 6b, ⋯ allow the phase of their output signals to be increased or decreased, irrespective of the input frequency, by any optional phase angle $\tan^{-1} |B/A|$ by optionally selecting A, B. At this time, the gain is represented by $(A^2+B^2)^{1/2}$.

Figure 12:
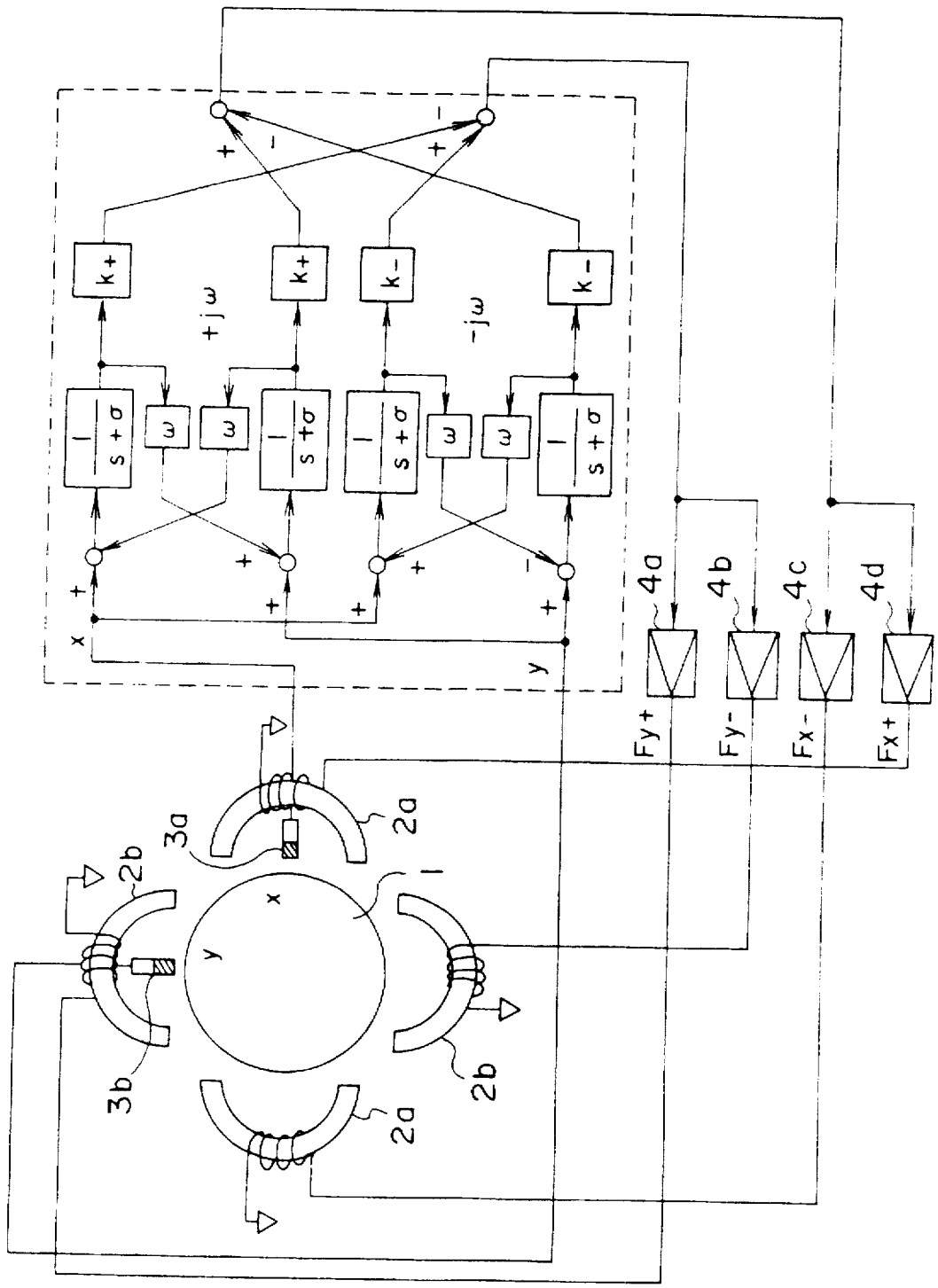
FIG. 12 is a block diagram of a control apparatus which incorporates a control circuit for controlling a rotor according to another embodiment of the present invention.

A closed-loop system for stabilizing the above control circuit to control a magnetic bearing, for example, is shown in FIGS. 12 and 13.

In FIG. 12, pass filters 5a, 5b select and pass respective frequencies +ω, −ω. Complex gain circuits 6a, 6b are set to $A_1=0$, $B_1=+k_+$ and $A_2=0$, $B_2=-k_-$, respectively. Therefore, a signal having the frequency +ω is subject to a phase change of 90 degrees and a gain $k_+$, and a signal having the frequency −ω is subject to a phase change of −90 degrees and a gain $k_-$. FIG. 13 is a complex expression block diagram which expresses the dynamic characteristics of the controlled system shown in FIG. 12 as $1/(s^2+\omega^2)$.

The complex gain circuits 6a, 6b may operate with a phase lead or lag. Since their gains are free of dynamic characteristics, the gains are not increased with a phase lead insofar as the ratio B/A is maintained and they are not too large. A plurality of passages for selecting frequencies (bands) may be provided, and gains and phases required for stabilization may be given to them.

Figure 14:
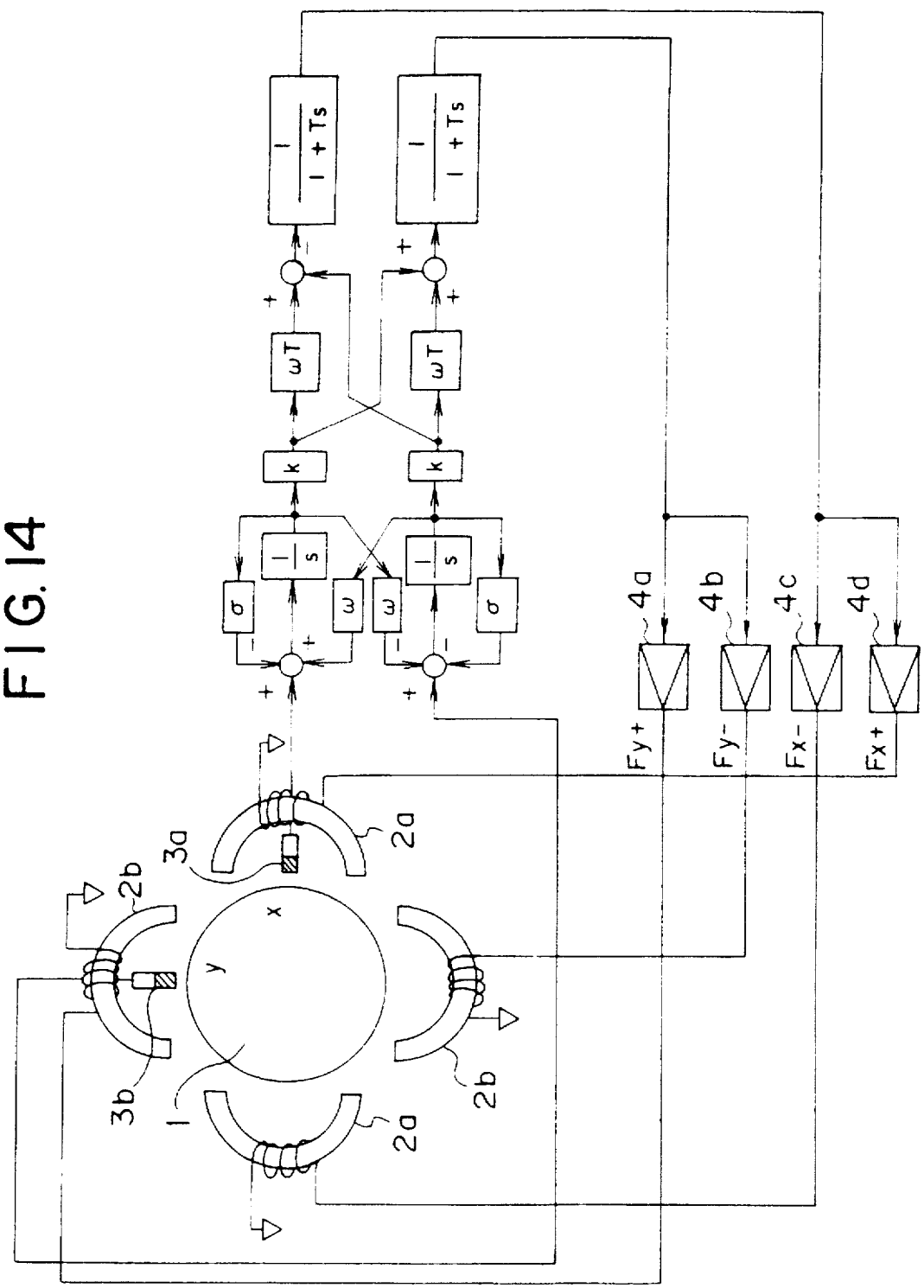
FIG. 14 is a block diagram of a control apparatus which incorporates a control circuit for controlling a rotor according to still another embodiment of the present invention.

FIG. 14 shows a control apparatus which incorporates a control circuit for controlling a rotor according to still another embodiment of the present invention. The control apparatus shown in FIG. 14 is employed in the case where an object to be controlled has the same dynamic characteristics as shown in FIG. 13 and comprises electromagnets, for example, for producing control forces, the electromagnets having a time lag of first order with a large time constant T, and where a transfer function for the time lag is represented by 1/(1+Ts), and a +jω mode is given sufficient damping for some reasons, but only a −jω is given insufficient damping. In this case, only a −jω mode component may be selected, given a constant complex gain $\underline{k}$, and fed back.

An equation of motion of an entire system including the feedback loops, as having been Laplace-transformed, is given by:

$$s^2+\omega^2=\underline{k}/[(1+Ts)(s+\sigma+j\omega)] \tag{20}$$

where $\underline{k}$ is a complex number.

A characteristic equation of this system is indicated as follows:

$$F_s(s)=(s^2+\omega^2)(1+Ts)(s+\sigma+j\omega)-\underline{k}=0 \tag{21}$$

If the characteristic equation is Taylor-expanded in the vicinity of s=−jω, then it is approximately expressed by:

$$F_s(s)|_{s=-j\omega}=-2j\omega\sigma(1-j\omega T)(s+j\omega)-\underline{k} \tag{22}$$

Therefore, a solution in the vicinity of s=−jω is given as:

$$s=-j\omega+\underline{k}/\{-2j\omega\sigma(1-j\omega T)\} \tag{23}$$

The second term of the right-hand side of the above equation is preferably a negative real number. Consequently, if $$\underline{k}=j(1-j\omega T)k \tag{24}$$

then the solution becomes:

$$s=-j\omega-k/2\omega\sigma \tag{25}$$

where k is a positive real number and corresponds to a usual feedback gain. Thus, the equation (20) is expressed as follows:

$$s^2+\omega^2=jk(1-j\omega T)/[(1+Ts)(s+\sigma+j\omega)] \tag{26}$$

In the equation (26), (1−jωT) is newly added to the numerator in order to remove the influence of the time lag of first order. If a sensor output signal is represented by x+jy, then a specific connection of the numerator exclusive of the selective filter is expressed by:

$$(x+jy)jk(1-j\omega T)=k[-y+x\omega T+j(x+y\omega T)] \tag{27}$$

and hence the connection is as shown in FIG. 14. In this control circuit, only the frequency −ω of the frequencies ±ω is passed by the selective filter to compensate for the lag of the electromagnets for thereby giving damping.

FIG. 15 shows in block diagram form a tracking filter according to the present invention. A tracking filter is used to extract a rotational synchronizing component to remove a vibrational component close to a rotational speed, or to increase the stiffness of a bearing only in the vicinity of a rotational speed.

The tracking filter according to the present invention resides in that the frequency ω fed back along the crossing passages is not a constant, but a variable, in the bandpass filter described with reference to FIG. 1. Specifically, signals from the displacement sensors 3a, 3b or voltage signals, corresponding to a rotational speed, generated by sensors for detecting the rotational speed, are applied as a variable to multiply output signals from the integrators, σ which is fed back from the output signals from the integrators is one half of the pass bandwidth, and serves to operate as a low-pass filter as well as to prevent the selective passages from oscillating. If σ is suppressed to a magnitude large enough to include an error of a generated voltage corresponding to the rotational speed, then noise and unwanted signals other than the rotational synchronizing signal are filtered out.

Although certain preferred embodiments of the present invention have been shown and described in detail, it should be understood that various changes and modifications may be made therein without departing from the scope of the appended claims.

What is claimed is:

1. An apparatus for controlling a rotor in a system for electromagnetically controlling two radial x- and y-axes perpendicular to a rotational z-axis of the rotor, comprising:

displacement sensors for sensing displacements of the rotor along x- and y-axes;

a filter circuit for outputting an output signal which is obtained by multiplying the both sides of a transfer expression formula:

$$U \cdot F(s-j\omega)=V$$

by the denominator of $\underline{F}(s-j\omega)$, and connecting transfer elements of the real-number coefficient so that real and imaginary parts of the transfer expression formula are equal to each other, wherein a signal input from said displacement sensors related to the x- and y-axes (Laplace transform quantities thereof are presented by Ux, Uy) is expressed by a complex variable ($\underline{U}=Ux+jUy$), a transfer function of a low-pass or high-pass filter having a real-number coefficient is represented by F(s), a central angular frequency, which may be either positive or negative, to be passed or rejected, is represented by ω, an imaginary number unit is represented by j, and a complex coefficient transfer function produced by replacing "s" in the transfer function F(s) with (s−jω) is represented by $\underline{F}(s-j\omega)$, and said output signal related to the x- and y-axes (Laplace transform quantities thereof are presented by Vx, Vy) which is generated when the input signal $\underline{U}$ passes through the complex coefficient transfer function $\underline{F}(s-j\omega)$ is expressed using a complex variable ($\underline{V}=Vx+jVy$); and electromagnets controlling the position of the rotor as a function of said output signal output by said filter circuit.

2. An apparatus according to claim 1, wherein central angular frequencies, which may be either positive or negative, to be passed and rejected by said filter circuit are represented by $\omega_1$, $\omega_2$ ($\omega_1 \neq \omega_2$), and to pass a component including a bandwidth (2a) across the central angular frequency $\omega_1$ and reject a component including a bandwidth (2b) across the central angular frequency $\omega_2$, said complex coefficient transfer function is given as:

$$k(s+b-j\omega_2)/(s+a-j\omega_1)$$

or $$k(s+b-j\omega_2)/\{(s-j\omega_1)^2+2za(s-j\omega_1)+a^2\}$$

where "k" represents an optional gain or coefficient and "x" represents an optional dimensionless constant.

3. A filter circuit according to claim 2, wherein said complex transfer function is given as:

$$k(s+b-j\omega_2)/(s+a-j\omega_1)$$

and "a" is set small as long as the filter circuit does not oscillate so that the phase angle is inverted sharply for a bandwidth between the two angular frequencies $\omega_1$, $\omega_2$.

4. An apparatus according to claim 1, wherein the numerator and/or denominator of said transfer function F(s) includes a second-order system expressed by $k(s^2+2zas+a^2)$ where "k" represents an optional gain or coefficient and 2a represents a pass or rejection bandwidth across the central angular frequency, and wherein the opposite ends of the bandwidth near break points in gain characteristics of the frequency characteristics of the filter are made closer to those of an ideal filter by replacing "s" with (s−jω) and a dimensionless number "z" is selected as an optional number.

5. An apparatus according to claim 1, wherein a plurality of filter circuits are combined to pass or reject a particular band in an entire frequency band including a negative frequency range.

6. An apparatus according to claim 1, wherein the angular frequency ω is given as variables representing instantaneous values of the system.

7. A control circuit for controlling a rotor in a system for electromagnetically controlling two radial x- and y-axes perpendicular to a rotational z-axis of the rotor, including a filter section for extracting an angular frequency component or band component, which may be either positive or negative, from an input signal, and a phase section for giving a phase angle to the extracted component, so that an output signal which has passed through both said sections is used to estimate a state quantity required for control or fed back to stabilize a mode of the extracted component, wherein said phase section for giving a phase angle comprises a complex gain circuit expressed by $A+jB \equiv \underline{Fc}$ where A, B are real constants, and is connected such that an input signal (Ux, Uy) from the x- and y-axes to the complex gain circuit and an output signal (Vx, vy) from the complex gain circuit to the x- and y-axes are related to each other by Vx=AUx−BUy, Vy=BUx+AUy, and that the phase of the output signal can be increased or decreased by an optional phase angle irrespective of the frequency of the input signal by optionally selecting A, B, and an optional phase angle is given only to a frequency range required to estimate a control signal or a control-related signal.

8. The control circuit of claim 7, further comprising: electromagnets, controlling the position of the rotor as a function of said output signal.

9. A filter circuit for controlling a rotor in a system for electromagnetically controlling two radial axes perpendicular to a rotational axis of the rotor, by receiving an input signal related to the two radial axes and extracting a positive or negative angular frequency component required to produce a two-axis control signal, wherein signal passages for the respective two radial axes have respective integrators, negative feedback loops for feeding back output signals from said integrators with a gain which is ½ of a pass bandwidth, and feedback loops for feeding back output signals from said integrators across between the two radial axes such that the output signal from one of the axes to the other axis is positive and the output signal from said other axis to said one of the axes is negative, said feedback loops having a central angular frequency to be passed which is inserted as a gain to selectively pass said central angular frequency therethrough.

10. The filter circuit of claim 9, further comprising:

electromagnets, controlling the position of the rotor as a function of said two-axis control signal.

11. A filter circuit for controlling a rotor in a system for electromagnetically controlling two radial axes perpendicular to a rotational axis of the rotor, by receiving an input signal related to the two radial axes and rejecting or passing a positive or negative angular frequency component required to produce a two-axis control signal, wherein signal passages for the respective two radial axes have direct passages each having a gain 1, parallel first-order low-pass filters branched respectively from said direct passages for producing respective output signals which are multiplied by a gain that is produced by subtracting ½ of a rejection bandwidth or a bottom bandwidth (distance between two external break points) for pass filter from a break frequency of the low-pass filters, and returned subtractively to said direct passages, and feedback passages for feeding back the output signals respectively from said low-pass filters to the low-pass filters across between the two radial axes, said feedback passages having a central angular frequency to be rejected or passed, inserted as a gain, said feedback passages being connected to said low-pass filters at junctions such that the output signal from one of the axes to the other axis is added at one of said junctions and the output signal from said other axis to said one of the axes is subtracted at the other of said junctions for thereby rejecting or passing a signal in a band across said central angular frequency.

12. The filter circuit of claim 11, further comprising:

electromagnets, controlling the position of the rotor as a function of said two-axis control signal.

13. A filter circuit for controlling a rotor in a system for electromagnetically controlling two radial axes perpendicular to a rotational axis of the rotor, by receiving an input signal related to the two radial axes, passing a positive or negative angular frequency component $\omega_1$ required to produce a two-axis control signal, and rejecting another positive or negative angular frequency component $\omega_2$.

wherein signal passages for the respective two radial axes have direct passages each having a gain 1, parallel circuits branched respectively from said direct passages, one of said parallel circuits having a gain that is produced by subtracting ½ of a pass bandwidth which is a break frequency of a first-order low-pass filter connected behind said one of the parallel circuits, from an angular frequency which is ½ of a rejection bandwidth, the other of said parallel circuits having a gain represented by $\omega_1-\omega_2$, said parallel circuits being connected to input terminals of respective first-order low-pass filters across between said two radial axes at junctions such that the output signal from one of the axes to the other axis is added at one of said junctions and the output signal from said other axis to said one of the axes is subtracted at the other of said junctions, and that said low-pass filters apply respective output signals additively to the respective direct passages and also feed back the output signals through a gain represented by $\omega_1$ to input terminals of the low-pass filters across between the two radial axes at junctions such that the output signal from one of the axes to the other axis is added at one of said junctions and the output signal from said other axis to said one of the axes is subtracted at the other of said junctions for thereby passing a nearby bandwidth across the frequency $\omega_1$ and rejecting a nearby bandwidth across the frequency $\omega_2$.

14. The filter circuit of claim 13, further comprising:

electromagnets, controlling the position of the rotor as a function of said two-axis control signal.

15. A control circuit for controlling a rotor in a system for electromagnetically controlling two radial axes perpendicular to a rotational axis of the rotor, by receiving an input signal related to the two radial axes and outputting a two-axis control signal, wherein an angular frequency component or band, which may be either positive or negative, is extracted from the said input signal, and signal passages related respectively to the two radial axes are branched into respective branch passages, and each of said signal passages applies an output signal through a gain represented by a first constant A, each of said branch passage applies an output signal through a gain represented by a second constant B to the opposite signal passage to the one from which said each of the branch passages branched, across between the two radial axes at junctions such that the output signal from one of the axes to the other axis is added at one of said junctions and the output signal from said other axis to said one of the axes is subtracted at the other of said junctions.

16. The control circuit of claim 15, further comprising:

electromagnets, controlling the position of the rotor as a function of said two-axis control signal.

\* \* \* \* \*

UNITED STATES PATENT AND TRADEMARK OFFICE
CERTIFICATE OF CORRRECTION

PATENT NO. : 5,736,801
DATED : April 7, 1998
INVENTOR(S) : Murakami

It is certified that error appears in the above-identified patent and that said Letters Patent is hereby corrected as shown below:

On the title page item [56], insert --

OTHER DOCUMENTS

| | |
|---|---|
| | 1985 INTERNATIONAL SYMPOSIUM ON CIRCUITS AND SYSTEMS: 5-7 JUNE 1985, KYOTO, JP., A. SEDRA ET AL.; COMPLEX ANALOG BANDPASS FILTERS DESIGNED BY LINEARLY SHIFTING REAL LOW-PASS PROTOTYPES, p. 1223-1226 |
| | |

In claim 3 on line 1 of column 14, please change "A filter circuit" to be --An apparatus--

Signed and Sealed this

Thirtieth Day of March, 1999

Attest:

Attesting Officer

Q. TODD DICKINSON

Acting Commissioner of Patents and Trademarks